(12) United States Patent
Kubota et al.

(10) Patent No.: US 12,265,139 B2
(45) Date of Patent: Apr. 1, 2025

(54) MAGNETO-RESISTIVE ELEMENT AND MAGNETIC SENSOR

(71) Applicant: Murata Manufacturing Co., Ltd., Nagaokakyo (JP)

(72) Inventors: Masashi Kubota, Nagaokakyo (JP); Korekiyo Ito, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 493 days.

(21) Appl. No.: 17/406,128

(22) Filed: Aug. 19, 2021

(65) Prior Publication Data

US 2021/0382123 A1  Dec. 9, 2021

Related U.S. Application Data

(63) Continuation of application No. PCT/JP2020/003452, filed on Jan. 30, 2020.

(30) Foreign Application Priority Data

Apr. 9, 2019  (JP) ................. 2019-074190

(51) Int. Cl.
*G01R 33/09* (2006.01)
*H10B 61/00* (2023.01)
*H10N 59/00* (2023.01)

(52) U.S. Cl.
CPC ........... *G01R 33/093* (2013.01); *H10B 61/00* (2023.02); *H10N 59/00* (2023.02)

(58) Field of Classification Search
CPC .... G01R 33/09; G01R 33/091; G01R 33/093; G01R 33/098; H10N 50/80; H10N 50/10; H10N 59/00; H10B 61/00; H01L 29/82
See application file for complete search history.

(56) References Cited

U.S. PATENT DOCUMENTS

| 2008/0180865 A1 | 7/2008 | Min et al. |
| 2015/0185297 A1 | 7/2015 | Zimmer et al. |
| 2017/0168122 A1 | 6/2017 | Raberg et al. |

(Continued)

FOREIGN PATENT DOCUMENTS

| JP | 2017-112375 A | 6/2017 |
| JP | 2017-191841 A | 10/2017 |

OTHER PUBLICATIONS

Official Communication issued in International Patent Application No. PCT/JP2020/003452, mailed on Mar. 24, 2020.

(Continued)

*Primary Examiner* — David M Schindler
(74) *Attorney, Agent, or Firm* — Keating & Bennett, LLP

(57) ABSTRACT

A magneto-resistive element includes a first element section including a first unit element and a second element section including a second unit element. The first element section is connected to the second element section in series. The first unit element includes a first reference layer with a magnetization that is fixed in an in-plane direction, and a first free layer including a vortex magnetization. The second unit element includes a second reference layer with a magnetization that is fixed in an in-plane direction, and a second free layer including a vortex magnetization. A direction of the fixed magnetization of the first reference layer is opposite to that of the second reference layer.

18 Claims, 9 Drawing Sheets

(56) References Cited

U.S. PATENT DOCUMENTS

| | | | |
|---|---|---|---|
| 2018/0164387 A1 | 6/2018 | Raberg | |
| 2019/0227129 A1* | 7/2019 | Deak | G01R 33/0005 |
| 2020/0064157 A1* | 2/2020 | Marauska | G01D 5/145 |
| 2021/0255255 A1* | 8/2021 | Hammerschmidt | H01F 41/304 |
| 2021/0325486 A1* | 10/2021 | Cai | G01D 5/2451 |
| 2022/0196764 A1* | 6/2022 | Dounia | G01R 33/098 |

OTHER PUBLICATIONS

Zhu et al., "Magnetic tunnel junctions", Materials today, vol. 9, No. 11, Nov. 2006, pp. 36-45.

Ando, "Development of bio-magnetic field sensor with TMR devices", Department of Applied Physics, Graduate School of Engineering, Tohoku University, Nov. 27, 2017, pp. 17-25.

Antos et al., "Magnetic Vortex Dynamics", Journal of the Physical Society of Japan, vol. 77., No. 3, Mar. 2008, pp. 1-8.

Schneider et al., "Lorentz microscopy of circular ferromagnetic permalloy nanodisks", Applied Physics Letters, vol. 77, No. 18, Oct. 30, 2000, pp. 2909-2911.

Wurft et al. "The Influence of Edge Inhomogeneities on Vortex Hysteresis Curves in Magnetic Tunnel Junctions" IEEE Transactions on Magnetics, vol. 53, No. 11, Nov. 2017, pp. 1-5.

Endo et al., "Magnetic tunnel junction sensor applying magnetic vortex state", 39th Annual Meeting of the Magnetics Society of Japan, 10pE-12, 2015, p. 277.

Nakano et al., "Influence of stray field from pinned layer on linearity in magnetic tunnel junctions for magnetic sensor", 39th Annual Meeting of the Magnetics Society of Japan, 10pE-13, 2015, p. 278.

Yoshida et al., "Tunnel magnetoresistance properties and interface diffusion of MTJs with post-oxidized MgO barriers", 39th Annual Meeting of the Magnetics Society of Japan, 10pE-14, 2015, p. 279.

Takamura et al., "Inverse-magnetostriction-induced switching current reduction for spin-transfer torque MTJs", 39th Annual Meeting of the Magnetics Society of Japan, 10pE-15, 2015, p. 280.

Yamada et al., "Effect of the Gilbert damping constant on the switching current in the spin-transfer switching with the thermal fluctuation interaction", 39th Annual Meeting of the Magnetics Society of Japan, 10pE-16, 2015, p. 281.

Yu et al., "Numerical study on microwave assisted spin transfer switching in a multilayer with perpendicular aniosotropy", 39th Annual Meeting of the Magnetics Society of Japan, 10pE-17, 2015, p. 282.

\* cited by examiner

FIG.6

|  |  | FIRST COMPARISON EXAMPLE | FIRST EMBODIMENT EXAMPLE | SECOND EMBODIMENT EXAMPLE | THIRD EMBODIMENT EXAMPLE | FOURTH EMBODIMENT EXAMPLE |
|---|---|---|---|---|---|---|
| MR RATIO (%) | | 25.4 | 25.4 | 25.4 | 25.4 | 25.4 |
| FILM THICKNESS t (nm) | | 15 | 15 | 15 | 15 | 15 |
| FIRST UNIT ELEMENT | ASPECT RATIO t/D | 0.038~0.330 | 0.042 | 0.044 | 0.048 | 0.052 |
| | DISK DIAMETER D (nm) | 395.7~45.5 | 355.3 | 341.8 | 314.9 | 288.0 |
| | RESISTANCE VALUE R (kΩ) | 10.0 | 10.0 | 10.0 | 10.0 | 10.0 |
| SECOND UNIT ELEMENT | ASPECT RATIO t/D | --- | 0.037 | 0.037 | 0.037 | 0.037 |
| | DISK DIAMETER D (nm) | --- | 395.7 | 395.7 | 395.7 | 395.7 |
| | RESISTANCE VALUE R (kΩ) | --- | 1.8 | 1.3 | 0.7 | 0.4 |

IN COMPARISON EXAMPLE, ASPECT RATIO IS CHANGED IN RANGE DESCRIBED ABOVE.

FIG.7

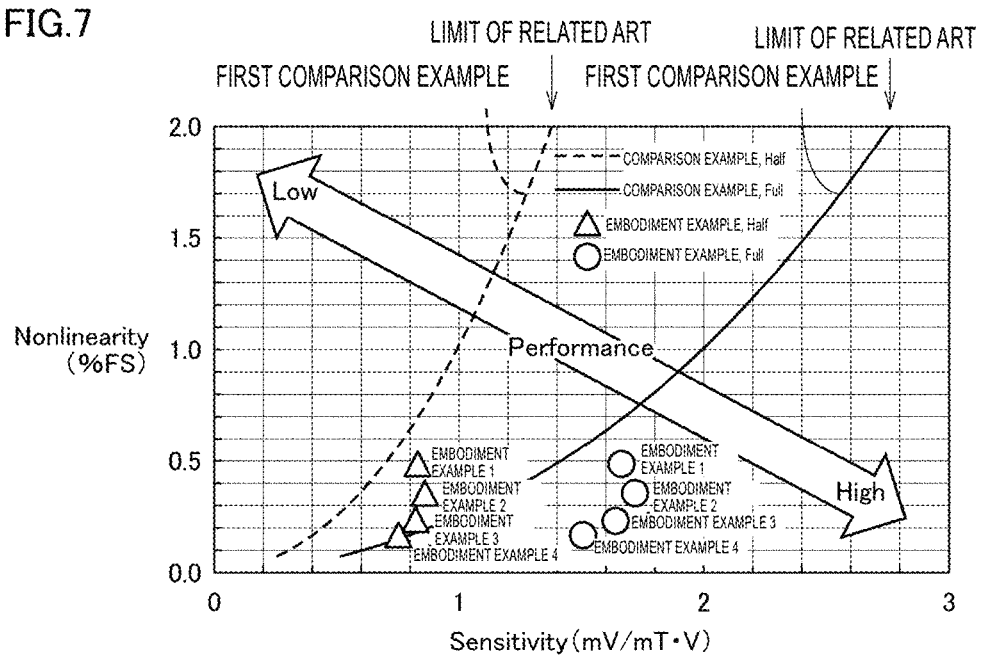

MAGNETO-RESISTIVE ELEMENT AND MAGNETIC SENSOR

CROSS REFERENCE TO RELATED APPLICATIONS

This application claims the benefit of priority to Japanese Patent Application No. 2019-074190 filed on Apr. 9, 2019 and is a Continuation Application of PCT Application No. PCT/JP2020/003452 filed on Jan. 30, 2020. The entire contents of each application are hereby incorporated herein by reference.

BACKGROUND OF THE INVENTION

1. Field of the Invention

The present disclosure relates to a magneto-resistive element and a magnetic sensor including a magneto-resistive element.

2. Description of the Related Art

J. Zhu and C. Park, "Magnetic Tunnel Junctions", Materials Today 9, 36 (2006) describes that, in a magnetic tunnel junction element of the related art, the tunnel magnetoresistance ratio (TMR ratio) indicating tunnel a magnetoresistance (TMR) effect is determined by the angle θ between magnetization M1 of a free layer and magnetization M2 of a pinned layer, as illustrated in FIG. 15. The free layer and the pinned layer are disposed with an insulating layer interposed in between.

FIG. 15 is a schematic view of the direction of magnetization M1 of the free layer and the direction of magnetization M2 of the pinned layer in a magnetic tunnel junction element of the related art in which the free layer and the pinned layer are disposed with the insulating layer interposed in between.

In FIG. 15, a magneto-resistive element 200, which includes a laminated portion 201 in which a pinned layer 202, a barrier layer 203, and a free layer 204 are laminated in this sequence, is disclosed. The relative angle of magnetization M1 of the free layer 204 with magnetization M2 of the pinned layer 202 is represented by θ.

The conductance due to tunnel magnetoresistance (TMR) effect is expressed by Expression (1) described below, by using the relative angle θ of the magnetization of the ferromagnetic layer on the upper side (M1) of the barrier layer with respect to the magnetization of the ferromagnetic layer on the lower side (M2).

$$G(\theta) = \tfrac{1}{2}(G_P + G_{AP}) + \tfrac{1}{2}(G_P - G_{AP})\cos\theta \quad \text{Expression (1)}$$

In this expression, $G_P = G(0°)$ which means that magnetization M1 is parallel to magnetization M2; $G_{AP} = G(180°)$ which means that magnetization M1 is antiparallel to magnetization M2. The TMR ratio is expressed by Expression (2) of Julliere's model described below.

$$\text{TMR ratio} = \frac{G_P - G_{AP}}{G_{AP}} = \frac{R_{AP} - R_P}{R_P} = \frac{2P_1 P_2}{1 - P_1 P_2} \quad \text{Expression (2)}$$

In this expression, $R_P$ represents a tunnel resistance in the case where magnetization M1 is parallel to magnetization M2, and $R_{AP}$ represents a tunnel resistance in the case where magnetization M1 is antiparallel to magnetization M2. P1 and P2 represent the spin polarization of the pinned layer 202 and the free layer 204.

FIG. 16 is a diagram illustrating various magnetic tunnel junction elements of the related art and characteristics of the magnetic tunnel junction elements.

"TMR-wo-mochiita-seitai-jiki-sensa-no-kaihatsu (Development of biometric magnetic sensor using TMR)," (Yasuo Ando, the fifth Iwasaki conference "Shakai-kiban-no-kojo-ni-tsunagaru-jiki-sensa-to-sono-katsuyou (Magnetic sensors that improves social infrastructure and their use)," November 27, Heisei 29) describes various magnetic tunnel junction elements and characteristics of the magnetic tunnel junction elements, as illustrated in FIG. 16.

In FIG. 16, three magnetic tunnel junction elements are disclosed one by one from the left. In the first magnetic tunnel junction element from the left, the magnetization of the pinned layer is oriented in an in-plane direction parallel to the film surface, and the magnetization of the free layer is also oriented in an in-plane direction. The external magnetic field to be detected changes in the direction parallel to the film surface of the pinned layer.

In the second magnetic tunnel junction element from the left, the magnetization of the pinned layer is oriented in an in-plane direction parallel to the film surface, and the magnetization of the free layer is oriented in the direction perpendicular to the film surface of the pinned layer. The external magnetic field to be detected changes in a direction parallel to the film surface of the pinned layer.

In the third magnetic tunnel junction element from the left, the magnetization of the pinned layer is oriented in the direction perpendicular to the film surface. The magnetization of the free layer is oriented in an in-plane direction parallel to the film surface of the pinned layer. The external magnetic field to be detected changes in the direction perpendicular to the film surface of the pinned layer.

The first one from the left has a layered structure of in-plane free layer/barrier layer/in-plane reference layer, and has a structure in which the magnetization direction of the free layer is biased in the direction of 90° with respect to the reference layer and in which the magnetic field having a direction of 0° is detected. Use of this structure allows selection of a film configuration having a high tunnel magnetoresistance ratio.

However, in this configuration, application of a bias magnetic field requires electromagnets or magnets, resulting in an increase in the number of component members. In addition, non-uniformity of the products worsens, and the reliability also degrades. Further, the manufacture cost increases.

As magneto-resistive elements which enable the problems described above to be reduced, magneto-resistive elements having magnetic vortex structures described below have been developed.

R. Antos, Y. Otani and J. Shibata, "Magnetic Vortex Dynamics", J. Phys. Soc. Jpn. 77, 031004 (2008) discloses a magnetic vortex structure (vortex) as a phenomenon in which a special response is produced to a magnetic field, as illustrated in FIG. 17.

FIG. 17 is a diagram illustrating a hysteresis loop in a magneto-resistive element having a magnetic vortex structure of the related art. As illustrated in FIG. 17, in the hysteresis loop in a magneto-resistive element having a magnetic vortex structure, a linear range occurs in a portion of the magnetization curve.

M. Schneider, H. Hoffmann and J. Zweck, "Lorentz Microscopy of Circular Ferromagnetic Permalloy Nanodisks", Appl. Phys. Lett. 77, 2909 (2000) discloses the relationship between the disk diameter of a magneto-resistive element having a magnetic vortex structure, and the saturated magnetic field and the nucleation magnetic field, as illustrated in FIG. 18.

FIG. 18 is a diagram illustrating the disk diameter of a magneto-resistive element having a magnetic vortex structure of the related art, and the saturated magnetic field and the nucleation magnetic field. As illustrated in FIG. 18, in a magneto-resistive element having a magnetic vortex structure, as the disk diameter (disk aspect ratio=film pressure of free layer/disk diameter) decreases, the difference between the saturated magnetic field and the nucleation magnetic field increases. That is, the linear range of the magneto-resistive element having the magnetic vortex structure enlarges as the disk diameter (disk aspect ratio) decreases.

As illustrated in FIGS. 19 to 21, in U.S. Patent Application Publication No. 2008/0180865, a method of using a magnetic vortex structure (vortex) in a giant magnetoresistance (GMR) or tunnel magnetoresistance (TMR) sensor in order to obtain odd-function linear input magnetic field-resistance characteristics has been proposed.

FIG. 19 is a schematic sectional view of a magnetic sensor in which a magneto-resistive element having a magnetic vortex structure of the related art is embedded. FIG. 20 is a schematic top view of the magnetic sensor in FIG. 19. FIG. 21 is a diagram illustrating responsivity of the magnetic sensor in FIG. 19.

As illustrated in FIGS. 19 and 20, U.S. Patent Application Publication No. 2008/0180865 discloses a structure in which a magneto-resistive component 301 includes a laminated portion obtained by laminating, in this sequence, a reference layer 302, a barrier layer 303, and a free layer 304 having the magnetic vortex structure, and in which the magneto-resistive component 301 is disposed between a lower shield 310 and an upper shield 320 which are made of magnetic permeable material. The reference layer 302 has its magnetization fixed in an in-plane direction. The free layer 304 has a vortex magnetization.

As illustrated in FIG. 21, current flowing in the direction perpendicular to the film surface of the reference layer 302 changes substantially linearly with respect to a change in a magnetic field.

Magneto-resistive elements having magnetic vortex structures are also disclosed in U.S. Patent Application Publication No. 2015/0185297, "Jikiuzu-kozo-wo-oyoshita-kyoujisei-tonneru-setsugo-jiba-sensa (Ferromagnetic tunnel junction magnetic-field sensor with application of magnetic vortex structure)," Motoi Endo, Mikihiko Ogane, Hiroshi Nagamuma, and Yasuo Ando, "Jikiuzu-kozo-wo-oyoushita-kyoujisei-tonnel-setsugo-jiba-sensa (Ferromagnetic tunnel junction magnetic-field sensor with application of magnetic vortex structure)", The 39th Annual Conference in MAGNETICS in Japan, 10pE-12, 277 (2015), and T. Wurft, W. Raberg, K. Prugl, A. Satz, G. Reiss and H. Bruckl, "The influence of edge inhomogeneities on vortex hysteresis curves in magnetic tunnel junctions", IEEE Transactions on Magnetics AF-05, (2017).

As described above, U.S. Patent Application Publication No. 2008/0180865, U.S. Patent Application Publication No. 2015/0185297, and R. Antos, Y. Otani and J. Shibata, "Magnetic vortex dynamics", J. Phys. Soc. Jpn. 77, 031004 (2008), M. Schneider, H. Hoffmann and J. Zweck, "Lorentz microscopy of circular ferromagnetic permalloy nanodisks", Appl. Phys. Lett. 77, 2909 (2000), Motoi Endo, Mikihiko Ogane, Hiroshi Nagamuma, and Yasuo Ando, "Jikiuzu-kozo-wo-oyoushita-kyoujisei-tonnel-setsugo-jiba-sensa (Ferromagnetic tunnel junction magnetic-field sensor with application of magnetic vortex structure)", The 39th Annual Conference in MAGNETICS in Japan, 10pE-12, 277 (2015), and T. Wurft, W. Raberg, K. Prugl, A. Satz, G. Reiss and H. Bruckl, "The influence of edge inhomogeneities on vortex hysteresis curves in magnetic tunnel junctions", IEEE Transactions on Magnetics AF-05, (2017) disclose magneto-resistive elements having magnetic vortex structures. However, in all of the above documents, improvement of linearity in output has not been fully studied, described or achieved.

SUMMARY OF THE INVENTION

Preferred embodiments of the present invention provide magneto-resistive elements and magnetic sensors which each have a magnetic vortex structure and which achieve improved linearity in output.

A magneto-resistive element according to a preferred embodiment of the present disclosure includes a first element section that includes one or more first unit elements and a second element section that includes one or more second unit elements. The first element section is connected to the second element section in series. Each first unit element includes a first reference layer, a first free layer, and a first barrier layer. The first reference layer includes a first film surface and has magnetization fixed in an in-plane direction of the first film surface. The first free layer has a vortex magnetization, whose center moves in accordance with an external magnetic field, about an axis perpendicular or substantially perpendicular to the first film surface. The first barrier layer is disposed between the first reference layer and the first free layer. The second element section includes a second reference layer, a second free layer, and a second barrier layer. The second reference layer includes a second film surface parallel or substantially parallel to the first film surface and has magnetization fixed in an in-plane direction of the second film surface. The second free layer has a vortex magnetization, whose center moves in accordance with the external magnetic field, about an axis perpendicular to the second film surface. The second barrier layer is disposed between the second reference layer and the second free layer. The direction of the fixed magnetization of the first reference layer is opposite to the direction of the fixed magnetization of the second reference layer.

In a magneto-resistive element according to a preferred embodiment of the present disclosure, nonlinearity distribution, with respect to a magnetic field, of resistance change characteristics of the first unit elements and nonlinearity distribution, with respect to the magnetic field, of resistance change characteristics of the second unit elements may have inverse signs.

In a magneto-resistive element according to a preferred embodiment of the present disclosure, nonlinearity distribution, with respect to a magnetic field, of change characteristics of combined resistance of the first element section and the second element section may have two extrema on each of the positive side of the nonlinearity in the range of a magnetic field for detection (the range of the magnetic field between about −20 mT and about 20 mT inclusive).

In a magneto-resistive element according to a preferred embodiment of the present disclosure, the direction of resistance change of the first element section with respect to the external magnetic field and the direction of resistance change of the second element section with respect to the external magnetic field may have inverse signs.

In a magneto-resistive element according to a preferred embodiment of the present disclosure, the resistance of the first element section may be greater than the resistance of the second element section.

In a magneto-resistive element according to a preferred embodiment of the present disclosure, the absolute value of sensitivity of the first unit elements may be smaller than the absolute value of sensitivity of the second unit elements. Nonlinearity of resistance change characteristics of the first unit elements may be smaller than nonlinearity of resistance change characteristics of the second unit elements.

In a magneto-resistive element according to a preferred embodiment of the present disclosure, the first free layer and the second free layer may have disk shapes. In this case, the diameter of the second free layer may be larger than the diameter of the first free layer.

In a magneto-resistive element according to a preferred embodiment of the present disclosure, a number of the first unit elements may be greater than a number of the second unit elements.

A magnetic sensor according to a preferred embodiment of the present disclosure includes a plurality of magneto-resistive elements described above. The plurality of magneto-resistive elements include a first magneto-resistive element and a second magneto-resistive element which define a half-bridge circuit. The direction of the fixed magnetization of the first reference layer in the first magneto-resistive element is opposite to the direction of the fixed magnetization of the first reference layer in the second magneto-resistive element.

In a magnetic sensor according to a preferred embodiment of the present disclosure, the plurality of magneto-resistive elements may further include a third magneto-resistive element and a fourth magneto-resistive element. In this case, the first magneto-resistive element and the second magneto-resistive element may define a first half-bridge circuit. The third magneto-resistive element and the fourth magneto-resistive element may define a second half-bridge circuit. Further, the first half-bridge circuit and the second half-bridge circuit may define a full-bridge circuit. The direction of the fixed magnetization of the first reference layer in the first magneto-resistive element may be opposite to the direction of the fixed magnetization of the first reference layer in the second magneto-resistive element. The direction of the fixed magnetization of the first reference layer in the third magneto-resistive element may be opposite to the direction of the fixed magnetization of the first reference layer in the fourth magneto-resistive element. The direction of the fixed magnetization of the first reference layer in the first magneto-resistive element may be opposite to the direction of the fixed magnetization of the first reference layer in the third magneto-resistive element.

According to preferred embodiments of the present disclosure, magneto-resistive elements and magnetic sensors, which each have a magnetic vortex structure and which each achieve improved linearity in output, may be provided.

The above and other elements, features, steps, characteristics and advantages of the present invention will become more apparent from the following detailed description of the preferred embodiments with reference to the attached drawings.

BRIEF DESCRIPTION OF THE DRAWINGS

FIG. 6 is a diagram illustrating a condition for simulating the relationship between nonlinearity and sensitivity of magnetic sensors according to a comparative example and magnetic sensors according to examples of preferred embodiments of the present invention.

FIG. 7 is a diagram illustrating a simulation result of the relationship between nonlinearity and sensitivity of magnetic sensors according to a comparative example and magnetic sensors according examples of preferred embodiments of the present invention.

DETAILED DESCRIPTION OF THE PREFERRED EMBODIMENTS

Figure 1:
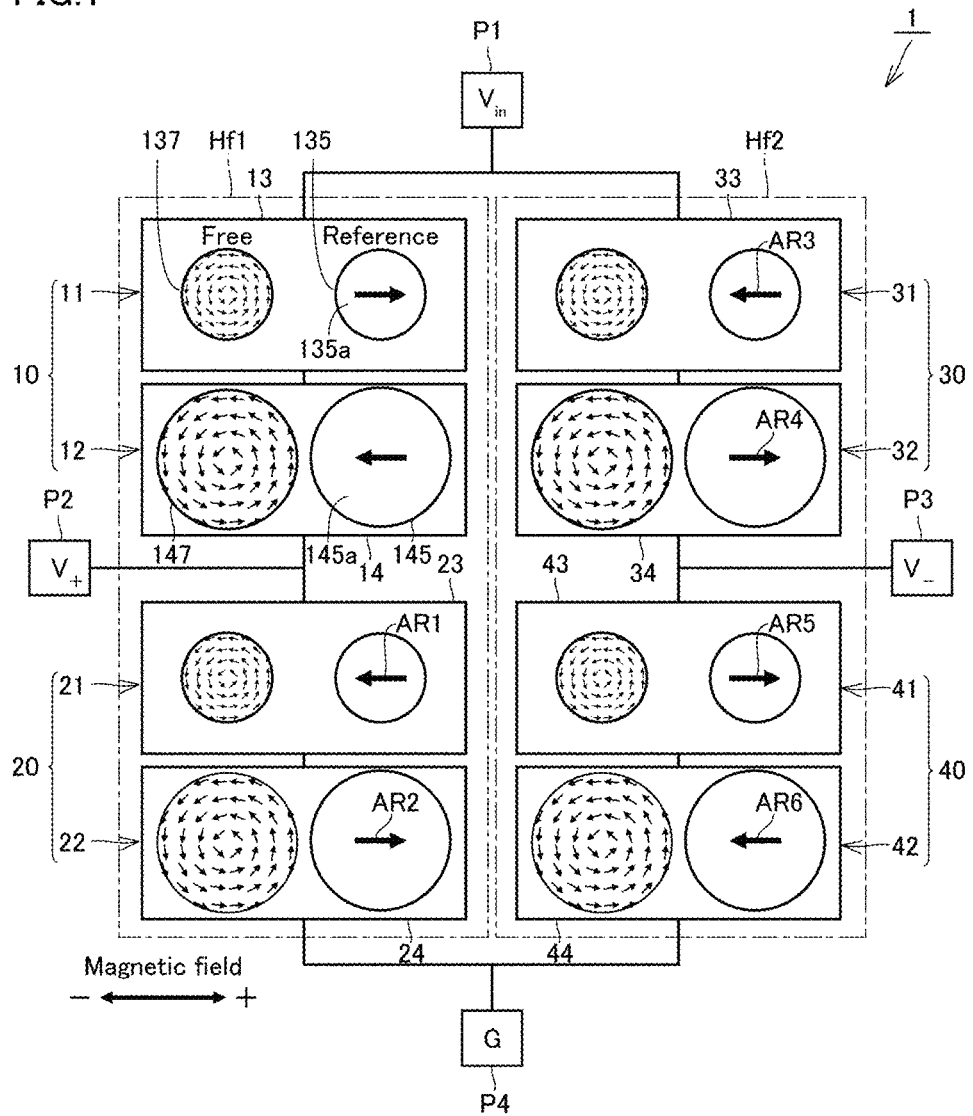
FIG. 1 is a schematic view of a magnetic sensor according to a first preferred embodiment of the present invention.

Preferred embodiments of the present disclosure will be described in detail below with reference to the drawings. In the preferred embodiments described below, the same or common elements and portions are designated with the same reference numerals in the drawings, and will not be described repeatedly.

First Preferred Embodiment

FIG. 1 is a schematic view of a magnetic sensor according to a first preferred embodiment of the present invention. In FIG. 1, for convenience's sake, portions (upper ferromagnetic layers defining and functioning as free layers and lower ferromagnetic layers defining and functioning as reference layers) of the layered structures included in magneto-resistive elements are illustrated side by side. Referring to FIG. 1, a magnetic sensor 1 according to the present preferred embodiment will be described.

As illustrated in FIG. 1, the magnetic sensor 1 includes a first magneto-resistive element 10, a second magneto-resistive element 20, a third magneto-resistive element 30, and a fourth magneto-resistive element 40. The first magneto-resistive element 10, the second magneto-resistive element 20, the third magneto-resistive element 30, and the fourth magneto-resistive element 40 define a full-bridge circuit.

Specifically, the first magneto-resistive element 10 is connected, on a first side, to an electrode section P1 to apply the power supply voltage Vin. The first magneto-resistive element 10 is connected, on a second side, to an electrode section P2 to derive the output voltage V+.

The second magneto-resistive element 20 is connected, on a first side, to the electrode section P2 to derive the output voltage V+. The second magneto-resistive element 20 is connected, on a second side, to an electrode section P4 defining and functioning as a ground electrode.

The third magneto-resistive element 30 is connected, on a first side, to the electrode section P1 to apply the power supply voltage Vin. The third magneto-resistive element 30 is connected, on a second side, to an electrode section P3 to derive the output voltage V−.

The fourth magneto-resistive element 40 is connected, on a first side, to the electrode section P3 to derive the output voltage V−. The fourth magneto-resistive element 40 is connected, on a second side, to the electrode section P4 defining and functioning as the ground electrode.

The series connection of the first magneto-resistive element 10 to the second magneto-resistive element 20 provides a first half-bridge circuit Hf1. The series connection of the third magneto-resistive element 30 to the fourth magneto-resistive element 40 provides a second half-bridge circuit Hf2.

The parallel connection of the first half-bridge circuit Hf1 to the second half-bridge circuit Hf2 provides a full-bridge circuit. The first magneto-resistive element 10 and the second magneto-resistive element 20 have positive output. The third magneto-resistive element 30 and the fourth magneto-resistive element 40 have negative output.

Application of the power supply voltage Vin between the electrode section P1 and the electrode section P4 causes the output voltages V+ and V− to be derived from the electrode section P2 and the electrode section P3 in accordance with the strength of a magnetic field. The output voltages V+ and V− are subjected to differential amplification through a differential amplifier (not illustrated).

The first magneto-resistive element 10 includes a first element section 11 and a second element section 12. The first element section 11 is connected to the second element section 12 in series. The first element section 11 has a resistance larger than that of the second element section 12.

The first element section 11 includes a first unit element 13. As described below, the first unit element 13 includes an upper ferromagnetic layer 137 which defines and functions as a first free layer, a lower ferromagnetic layer 135 which defines and functions as a first reference layer, and an insulating layer 136 which defines and functions as a first barrier layer and which is disposed between the upper ferromagnetic layer 137 and the lower ferromagnetic layer 135 (see FIG. 2). The lower ferromagnetic layer 135, the insulating layer 136, and the upper ferromagnetic layer 137 have the same or substantially the same disk shape, and are laminated in this sequence from the lower side.

The lower ferromagnetic layer 135 includes a first film surface 135a, and its magnetization is fixed in an in-plane direction of the first film surface 135a.

The upper ferromagnetic layer 137 has a magnetic vortex structure. The upper ferromagnetic layer 137 has a vortex magnetization about an axis perpendicular or substantially perpendicular to the first film surface 135a. The center of the vortex magnetization is moved in accordance with the external magnetic field.

The second element section 12 includes a second unit element 14. As described below, the second unit element 14 includes an upper ferromagnetic layer 147 which defines and functions as a second free layer, a lower ferromagnetic layer 145 which defines and functions as a second reference layer, and an insulating layer 146 which defines and functions as a second barrier layer and which is disposed between the upper ferromagnetic layer 147 and the lower ferromagnetic layer 145 (see FIG. 3). The lower ferromagnetic layer 145, the insulating layer 146, and the upper ferromagnetic layer 147 have the same or substantially the same disk shape, and are laminated in this sequence from the lower side. The disk diameter of the lower ferromagnetic layer 145, the insulating layer 146, and the upper ferromagnetic layer 147 in the second unit element 14 is larger than that of the lower ferromagnetic layer 135, the insulating layer 136, and the upper ferromagnetic layer 137 of the first unit element 13. Thus, as described above, the resistance of the first element section 11 is larger than that of the second element section 12.

The lower ferromagnetic layer 145 includes a second film surface 145a, and its magnetization is fixed in an in-plane direction of the second film surface 145a. The direction of the fixed magnetization of the lower ferromagnetic layer 145 is opposite to that of the lower ferromagnetic layer 135.

The upper ferromagnetic layer 147 has a magnetic vortex structure. The upper ferromagnetic layer 147 has a vortex magnetization about the axis perpendicular or substantially perpendicular to the first film surface 145a. The center of the vortex magnetization is moved in accordance with the external magnetic field.

The second magneto-resistive element 20 includes a first element section 21 and a second element section 22. The first element section 21 includes a first unit element 23. The second element section 22 includes a second unit element 24.

The first unit element 23 has a configuration the same as or similar to that of the first unit element 13 in the first magneto-resistive element 10. Compared with the first unit element 13, the first unit element 23 has a different magnetization direction fixed in the lower ferromagnetic layer defining and functioning as the first reference layer, as illustrated by arrow AR1 in FIG. 1.

Specifically, the direction of the fixed magnetization of the lower ferromagnetic layer in the first unit element 23 is opposite to that of the lower ferromagnetic layer 135 in the first unit element 13.

The second unit element 24 has a configuration the same as or similar to that of the second unit element 14 in the first magneto-resistive element 10. Compared with the second unit element 14, the second unit element 24 has a different magnetization direction fixed in the lower ferromagnetic layer defining and functioning as the second reference layer, as illustrated by arrow AR2 in FIG. 1.

Specifically, the direction of the fixed magnetization of the lower ferromagnetic layer in the second unit element 24 is opposite to that of the lower ferromagnetic layer 145 in the second unit element 14.

The third magneto-resistive element 30 includes a first element section 31 and a second element section 32. The first element section 31 includes a first unit element 33. The second element section 32 includes a second unit element 34.

The first unit element 33 has a configuration the same as or similar to that of the first unit element 13 in the first magneto-resistive element 10. Compared with the first unit element 13, the first unit element 33 has a different magnetization direction fixed in the lower ferromagnetic layer defining and functioning as the first reference layer, as illustrated by arrow AR3 in FIG. 1.

Specifically, the direction of the fixed magnetization of the lower ferromagnetic layer in the first unit element 33 is opposite to that of the lower ferromagnetic layer 135 in the first unit element 13.

The second unit element 34 has a configuration the same as or similar to that of the second unit element 14 in the first magneto-resistive element 10. Compared with the second unit element 14, the second unit element 34 has a different magnetization direction fixed in the lower ferromagnetic layer defining and functioning as the second reference layer, as illustrated by arrow AR4 in FIG. 1.

Specifically, the direction of the fixed magnetization of the lower ferromagnetic layer in the second unit element 34 is opposite to that of the lower ferromagnetic layer 145 in the second unit element 14.

The fourth magneto-resistive element 40 includes a first element section 41 and a second element section 42. The first element section 41 includes a first unit element 43. The second element section 42 includes a second unit element 44.

The first unit element 43 has the same or substantially the same configuration as that of the first unit element 13 in the first magneto-resistive element 10. The second unit element 44 has the same or substantially the same configuration as that of the second unit element 14 in the first magneto-resistive element 10.

As illustrated by arrows AR5 and AR6, the directions of the fixed magnetization of the lower ferromagnetic layers in the fourth magneto-resistive element 40 are opposite to those in the third magneto-resistive element 30.

Specifically, the direction of the fixed magnetization of the lower ferromagnetic layer in the first unit element 43 is opposite to that of the lower ferromagnetic layer in the first unit element 33. The direction of the fixed magnetization of the lower ferromagnetic layer in the second unit element 44 is opposite to that of the lower ferromagnetic layer in the second unit element 34.

Figure 2:
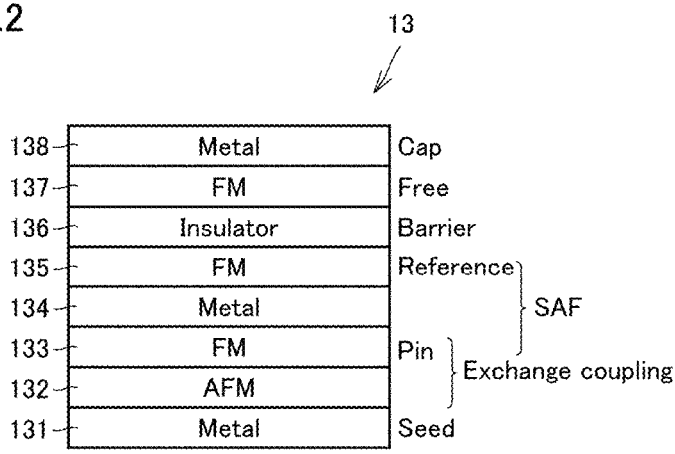
FIG. 2 is a sectional view of the layered structure of a first unit element included in a magneto-resistive element included in a magnetic sensor according to the first preferred embodiment of the present invention.

FIG. 2 is a sectional view of the layered structure of the first unit element included in a magneto-resistive element included in the magnetic sensor according to the first preferred embodiment. Referring to FIG. 2, the detailed structure of the first unit element 13 will be described.

As illustrated in FIG. 2, the first unit element 13 is a bottom-pinned TMR element using synthetic anti-ferromagnetic (SAF) coupling.

The first unit element 13 includes a lower electrode layer 131, an anti-ferromagnetic layer 132, a ferromagnetic layer 133, a non-magnetic layer 134, the lower ferromagnetic layer 135, the insulating layer 136, the upper ferromagnetic layer 137, and a cap layer 138.

The lower electrode layer 131 defines and functions as a seed layer which grows crystals of the anti-ferromagnetic layer 132 appropriately. As the lower electrode layer 131, for example, a laminated film of Ru and Ta may be used. Alternatively, for example, as the lower electrode layer 131, a single-metal film made of a different metal or alloy, or a laminated film including multiple types of metal films described above may be used.

The anti-ferromagnetic layer 132 is disposed on the lower electrode layer 131. As the anti-ferromagnetic layer 132, for example, PtMn may be used. Alternatively, for example, the anti-ferromagnetic layer 132 may be an alloy including Mn, such as IrMn.

The ferromagnetic layer 133 is disposed on the anti-ferromagnetic layer 132. As the ferromagnetic layer 133, for example, CoFe may be used. Alternatively, the ferromagnetic layer 133 may be, for example, CoFeB. The magnetization of the ferromagnetic layer 133 is fixed in a given in-plane direction due to the exchange coupling field applied from the anti-ferromagnetic layer 132.

The non-magnetic layer 134 is disposed on the ferromagnetic layer 133. As the non-magnetic layer 134, for example, Ru may be used.

The lower ferromagnetic layer 135 is disposed on the non-magnetic layer 134. As the lower ferromagnetic layer 135, for example, CoFeB may be used. Alternatively, the ferromagnetic layer 133 may be, for example, CoFe.

The ferromagnetic layer 133, the non-magnetic layer 134, and the lower ferromagnetic layer 135 define an SAF structure. This causes the magnetization direction of the lower ferromagnetic layer 135, defining and functioning as the first reference layer, to be firmly fixed.

The insulating layer 136 is disposed on the lower ferromagnetic layer 135. As the insulating layer, for example, MgO may be used. The insulating layer 136 is disposed between the upper ferromagnetic layer 137 and the lower ferromagnetic layer 135, and defines and functions as a tunnel barrier layer.

The upper ferromagnetic layer 137 is disposed on the insulating layer 136. As the upper ferromagnetic layer 137, for example, CoFeB may be used. Alternatively, the upper ferromagnetic layer 137 may be, for example, NiFe.

The upper ferromagnetic layer 137 has a magnetic vortex structure. The upper ferromagnetic layer 137 defines and functions as a free layer, and the direction of the magnetization of the upper ferromagnetic layer 137 changes in accordance with the external magnetic field.

The cap layer 138 is disposed on the upper ferromagnetic layer 137. For example, a laminated film of Ru and Ta may be used. Alternatively, for example, as the cap layer 138, a single-metal film of a different metal or alloy, or a laminated film including multiple types of metal films described above may be used.

The lower electrode layer 131, the anti-ferromagnetic layer 132, the ferromagnetic layer 133, the non-magnetic layer 134, the lower ferromagnetic layer 135, the insulating layer 136, the upper ferromagnetic layer 137, and the cap layer 138 described above are examples. Alternatively, a single-layer configuration may be used, or a configuration including multiple laminated layers may be used. The lower electrode layer 131, the anti-ferromagnetic layer 132, the ferromagnetic layer 133, the non-magnetic layer 134, the lower ferromagnetic layer 135, the insulating layer 136, the upper ferromagnetic layer 137, and the cap layer 138 described above may be appropriately provided.

Figure 3:
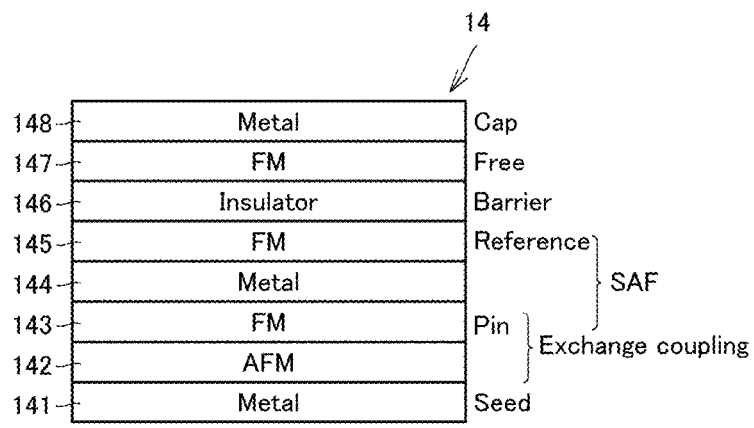
FIG. 3 is a sectional view of the layered structure of a second unit element included in a magneto-resistive element included in a magnetic sensor according to the first preferred embodiment of the present invention.

FIG. 3 is a sectional view of the layered structure of the second unit element included in a magneto-resistive element included in the magnetic sensor according to the first preferred embodiment. Referring to FIG. 3, the detailed structure of the second unit element 14 will be described.

As illustrated in FIG. 3, similar to the first unit element 13, the second unit element 14 is also a bottom-pinned TMR element using synthetic anti-ferromagnetic (SAF) coupling.

The second unit element 14 includes a lower electrode layer 141, an anti-ferromagnetic layer 142, a ferromagnetic layer 143, a non-magnetic layer 144, the lower ferromagnetic layer 145, the insulating layer 146, the upper ferromagnetic layer 147, and a cap layer 148.

The lower electrode layer 141, the anti-ferromagnetic layer 142, the ferromagnetic layer 143, the non-magnetic layer 144, the lower ferromagnetic layer 145, the insulating layer 146, the upper ferromagnetic layer 147, and the cap layer 148 have the same or similar configuration as that of the lower electrode layer 131, the anti-ferromagnetic layer 132, the ferromagnetic layer 133, the non-magnetic layer 134, the lower ferromagnetic layer 135, the insulating layer 136, the upper ferromagnetic layer 137, and the cap layer 138 in the first unit element 13.

As described above, the direction of the magnetization of the lower ferromagnetic layer 145, defining and functioning as a reference layer, in the second unit element 14 is opposite to that of the upper ferromagnetic layer 135.

The first unit elements and the second unit elements included in the second magneto-resistive element 20, the third magneto-resistive element 30, and the fourth magneto-resistive element 40 have the same or similar configurations which will not be described in detail.

Figure 4:
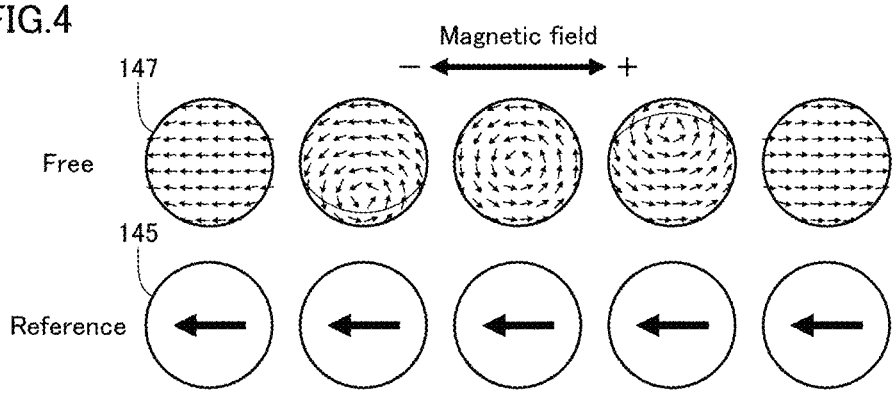
FIG. 4 is a diagram illustrating the state in which a vortex magnetization in an upper ferromagnetic layer is moved due to an external magnetic field, according to the first preferred embodiment of the present invention.

FIG. 4 is a diagram illustrating the state in which the vortex magnetization in an upper ferromagnetic layer is moved due to the external magnetic field, according to the first preferred embodiment.

FIG. 4 illustrates, as an example, a change in the direction of the vortex magnetization in the upper ferromagnetic layer 147 due to a change in the external magnetic field. The fixed magnetization of the lower ferromagnetic layer 145 defining and functioning as the second reference layer is oriented to the left in FIG. 4.

Figure 17:
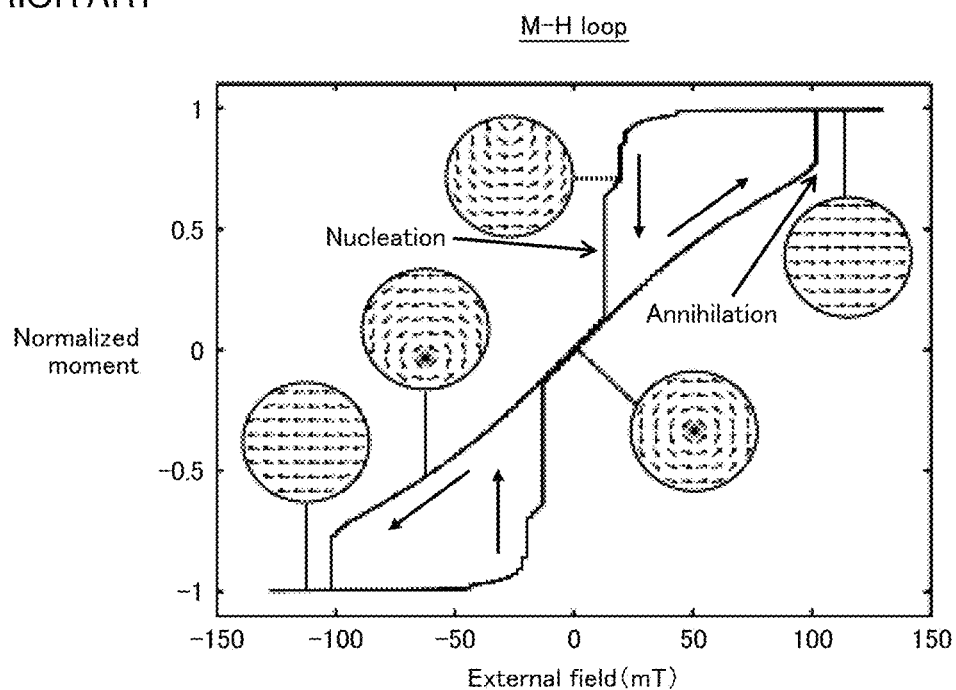
FIG. 17 is a diagram illustrating a hysteresis loop of a magneto-resistive element having a magnetic vortex structure of the related art.
Figure 18:
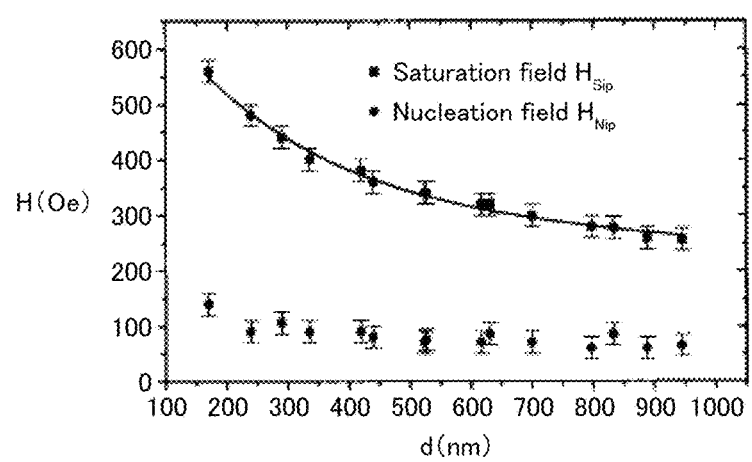
FIG. 18 is a diagram illustrating the disk diameters of magneto-resistive elements having a magnetic vortex structure of the related art, and the saturated magnetic field and the nucleation magnetic field.
Figure 19:
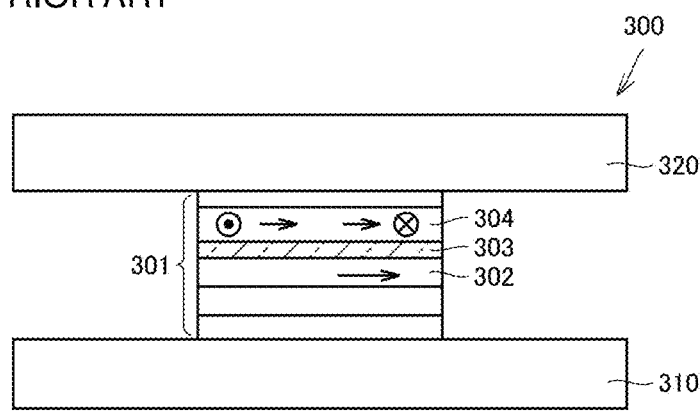
FIG. 19 is a schematic sectional view of a magnetic sensor in which a magneto-resistive element having a magnetic vortex structure of the related art is embedded.
Figure 20:
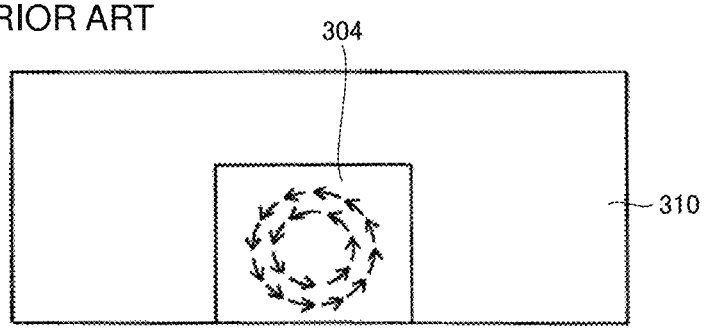
FIG. 20 is a schematic top view of the magnetic sensor in FIG. 19.
Figure 21:
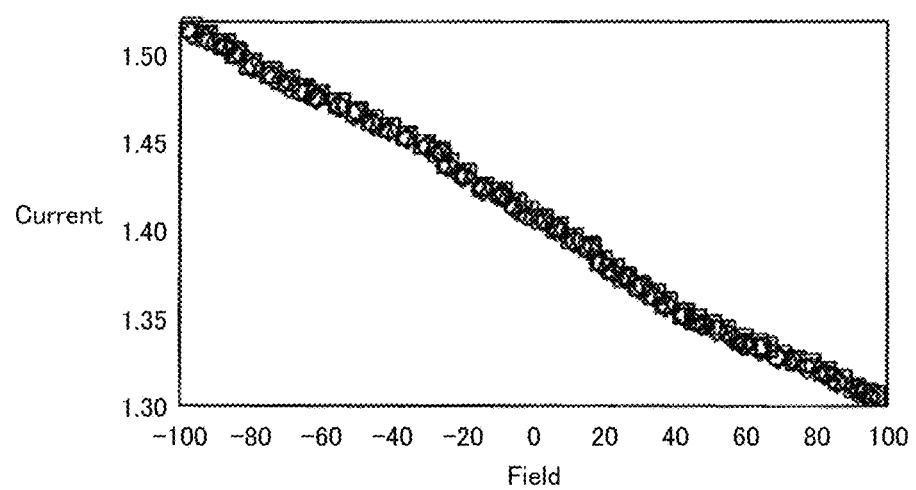
FIG. 21 is a diagram illustrating the responsivity of the magnetic sensor illustrated in FIG. 19.

In this case, the portion on the left side in FIG. 4 indicates the case in which the external magnetic field is strong in the negative direction. The portion at the center in FIG. 4 indicates the case in which the external magnetic field is not applied. The portion on the right side in FIG. 4 indicates the case in which the external magnetic field is strong in the positive direction. The states of the vortex magnetization in FIG. 4 approximately correspond to the states of the magnetic vortex illustrated at the positions of the magnetization curve in FIG. 17.

As illustrated in the center portion in FIG. 4, when the external magnetic field is not applied, the center of the magnetic vortex in the upper ferromagnetic layer 147 is positioned at the center or approximate center of the upper ferromagnetic layer 147.

As illustrated in the second portion from the left side in FIG. 4, when the external magnetic field is applied in the negative direction, the center of the magnetic vortex in the upper ferromagnetic layer 147 is moved downward in FIG. 4 from the center of the upper ferromagnetic layer 147. When the external magnetic field gets stronger in the negative direction, as illustrated in the first portion from the left in FIG. 4, the magnetic flux density of the upper ferromagnetic layer 147 is saturated, and the magnetization of the upper ferromagnetic layer 147 is parallel or substantially parallel to the direction of the fixed magnetization of the lower ferromagnetic layer 145.

As illustrated in the fourth portion from the left side in FIG. 4, when the external magnetic field is applied in the positive direction, the center of the magnetic vortex in the upper ferromagnetic layer 147 is moved upward in FIG. 4 from the center of the upper ferromagnetic layer 147. When the external magnetic field gets stronger in the positive direction, as illustrated in the fifth portion from the left in FIG. 4, the magnetic flux density of the upper ferromagnetic layer 147 is saturated, and the magnetization of the upper ferromagnetic layer 147 is antiparallel or substantially antiparallel to the direction of the fixed magnetization of the lower ferromagnetic layer 145.

Figure 5:
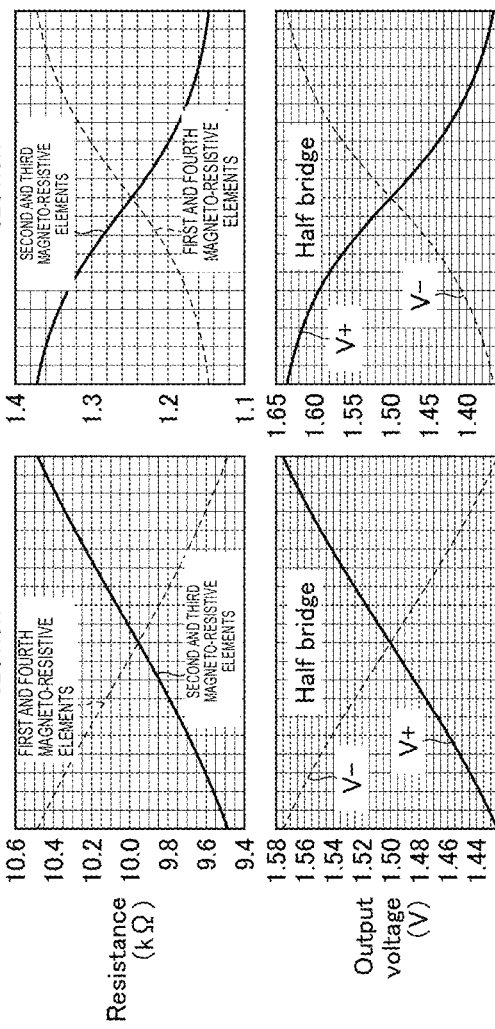
FIG. 5 is a diagram which describes cases in which corresponding magneto-resistive elements according to a first comparative example, a second comparative example, and the first preferred embodiment of the present invention are used to provide bridge circuits, and which illustrates, for each case, resistance change characteristics of the magneto-resistive element with respect to a magnetic field, output change characteristics with respect to the magnetic field, and nonlinear distribution of the output characteristics with respect to the magnetic field.

FIG. 5 is a diagram which describes the cases in which corresponding magneto-resistive elements according to a first comparative example, a second comparative example, and the first preferred embodiment are used to define bridge circuits, and which illustrates, for each case, resistance change characteristics of the magneto-resistive element with respect to a magnetic field, output change characteristics with respect to the magnetic field, and nonlinear distribution of the output characteristics with respect to the magnetic field.

In the first comparative example, magneto-resistive elements each including only the first element section 11 including the first unit element 13 are used to define a bridge circuit. In the second comparative example, magneto-resistive elements each including only the second element section 12 including the second unit element 14 are used to define a bridge circuit. In the first preferred embodiment, as described above, magneto-resistive elements each including both the first element section 11 and the second element section 12 are used to define a bridge circuit.

In each of the first comparative example, the second comparative example, and the first preferred embodiment, the MR ratio of the magneto-resistive elements is set to about 25.4%. Similarly, in each of the first comparative example and the first preferred embodiment, the thickness t of the upper ferromagnetic layer 137 in the first unit element 13 is set to about 15 nm; the disk diameter D of the upper ferromagnetic layer 137 is set to about 341.8 nm; and the aspect ratio (t/D) is set to about 0.044. The resistance value of the upper ferromagnetic layer 137 is set to about 10.0 kΩ. The range of a magnetic field to be detected extends from about −20 mT to about +20 mT.

In each of the second comparative example and the first preferred embodiment, the thickness t of the upper ferromagnetic layer 147 in the second unit element 14 is set to about 15 nm; the disk diameter D of the upper ferromagnetic layer 137 is set to about 395.7 nm; and the aspect ratio (t/D) is set to about 0.038. The resistance value of the upper ferromagnetic layer 147 is set to about 1.3 kΩ.

In the first comparative example, the external magnetic field is changed from about −20 mT to about +20 mT. Resistance change characteristics with respect to the magnetic field in this case are illustrated in the upper graph on the left side in FIG. 5.

Specifically, the resistance of the first magneto-resistive element and the fourth magneto-resistive element decreases from about 10.5 kΩ to about 9.5 kΩ, including a gentle curve. In contrast, the resistance of the second magneto-resistive element and the third magneto-resistive element increases from about 9.5 kΩ to about 10.5 kΩ, including a gentle curve.

In the first comparative example, the external magnetic field is changed from about −20 mT to +20 mT. Output characteristics in this case are illustrated in the middle graph on the left side in FIG. 5.

Specifically, the output voltage V+ increases from about 1.42 V to about 1.58 V, including a gentle curve. In contrast, the output voltage V− decreases from about 1.58 V to about 1.42 V, including a gentle curve.

In the first comparative example, the external magnetic field is changed from about −20 mT to +20 mT. Nonlinearity distribution of the output characteristics with respect to the magnetic field in this case is illustrated in the lower graph on the left side in FIG. 5.

Specifically, the nonlinearity distribution of the output voltage V+ has two inflection points in the positive magnetic field and the negative magnetic field in the range between about −20 mT and about +20 mT. The nonlinearity at the inflection point in the positive magnetic field has a positive value, and the nonlinearity at the inflection point in the negative magnetic field has a negative value. The nonlinearity distribution of the output voltage V− has two inflection points in the positive magnetic field and the negative magnetic field in the range between about −20 mT and about +20 mT. The nonlinearity at the inflection point in the positive magnetic field has a negative value, the nonlinearity at the inflection point in the negative magnetic field has a positive value.

In the second comparative example, the external magnetic field is changed from about −20 mT to about +20 mT. Resistance change characteristics with respect to the magnetic field in this case are illustrated in the upper graph in the center in FIG. 5.

Specifically, the resistance of the first magneto-resistive element and the fourth magneto-resistive element increases from about 1.14 kΩ to about 1.37 kΩ, including a curve. In contrast, the resistance of the second magneto-resistive element and the third magneto-resistive element decreases from about 1.37 kΩ to about 1.14 kΩ, including a curve.

The direction of resistance change of a magneto-resistive element with respect to the external magnetic field in the second comparative example and that in the first comparative example have inverse signs.

That is, the direction of resistance change of the second element section 12 with respect to the external magnetic field and that of the first element section 11 have inverse signs.

In the second comparative example, the external magnetic field is changed from about −20 mT to about +20 mT. Output characteristics in this case are illustrated in the middle graph in the center in FIG. 5.

Specifically, the output voltage V+ decreases from about 1.64 V to about 1.36 V, including a curve. In contrast, the output voltage V− increases from about 1.36 V to about 1.64 V, including a curve.

In the second comparative example, the external magnetic field is changed from about −20 mT to about +20 mT. Nonlinearity distribution of the output characteristics with respect to the magnetic field in this case is illustrated in the lower graph in the center in FIG. 5.

Specifically, the nonlinearity distribution of the output voltage V+ has two inflection points in the positive magnetic field and the negative magnetic field in the range between about −20 mT and about +20 mT. The nonlinearity at the inflection point in the positive magnetic field has a negative value, and the nonlinearity at the inflection point in the negative magnetic field has a positive value. The nonlinearity distribution of the output voltage V− has two inflection points in the positive magnetic field and the negative magnetic field in the range between about −20 mT and about +20 mT. The nonlinearity at the inflection point in the positive magnetic field has a positive value, and the nonlinearity at the inflection point in the negative magnetic field has a negative value.

In comparison of the second comparative example with the first comparative example, the nonlinearity distribution of the output characteristics in the second comparative example and that in the first comparative example have inverse signs.

That is, the nonlinearity distribution of the output characteristics in the bridge circuit defined by magneto-resistive elements each including only the second element section 12 having the second unit element 14, and that in the bridge circuit defined by magneto-resistive elements each including only the first element section 11 having the first unit element 13 have inverse signs.

The nonlinearity distribution of output characteristics with respect to a magnetic field has a correlation with the nonlinearity distribution of the resistance change characteristics of a magneto-resistive element with respect to the magnetic field.

The nonlinearity distribution, with respect to a magnetic field, of the resistance change characteristics of a magneto-resistive element including only the first element section including the first unit element 13 corresponds to the nonlinearity distribution, with respect to the magnetic field, of the resistance change characteristics of the first unit element 13.

Similarly, the nonlinearity distribution, with respect to a magnetic field, of the resistance change characteristics of a magneto-resistive element including only the second element section 12 including the second unit element 14 corresponds to the nonlinearity distribution, with respect to the magnetic field, of the resistance change characteristics of the second unit element 14.

Therefore, the nonlinearity distribution, with respect to a magnetic field, of the resistance change characteristics of the first unit element, and that of the second unit element also have inverse signs.

In the magnetic sensor 1 according to the first preferred embodiment, the external magnetic field is changed from about −20 mT to about +20 mT. Resistance change characteristics with respect to the magnetic field in this case are illustrated in the upper graph on the right side in FIG. 5.

The resistance of a magneto-resistive element in the first preferred embodiment is obtained by combining the resistance of the first element section 11 with the resistance of the second element section 12. As illustrated in the upper graph on the right side in FIG. 5, the resistance change characteristics of the first to fourth magneto-resistive elements have improved linearity compared with those of the first comparative example and the second comparative example.

More specifically, the resistance of the first magneto-resistive element and the fourth magneto-resistive element decreases from about 11.65 kΩ to about 10.85 kΩ with an enlarged linear range. In contrast, the resistance of the second magneto-resistive element and the third magneto-resistive element increases from about 10.85 kΩ to about 11.65 kΩ with an enlarged linear range.

In the first preferred embodiment, the external magnetic field is changed from about −20 mT to about +20 mT. Output characteristics in this case are illustrated in the middle graph on the right side in FIG. 5.

Specifically, the output characteristics are obtained by combining the output characteristics of the first element section 11 with the output characteristics of the second element section 12. The distributions of the output voltage V+ and the output voltage V− have improved linearity compared with those in the first comparative example and those in the second comparative example.

Specifically, the output voltage V+ increases from about 1.45 V to about 1.55 V with an enlarged linear range. The output voltage V− decreases from about 1.55 V to about 1.45 V with an enlarged linear range.

In the case where, as in the magnetic sensor 1 according to the present preferred embodiment, a full-bridge circuit is defined by magneto-resistive elements each including both the first element section 11 and the second element section 12, the external magnetic field is changed from about −20 mT to about +20 mT. Nonlinearity distribution, with respect to the magnetic field, of the half-bridge output characteristics in this case is illustrated in the lower graph on the right side in FIG. 5.

For both the output voltage V+ and the output voltage V−, the nonlinearity distribution of the output characteristics with respect to the magnetic field has two inflection points (extrema) on the positive side of nonlinearity and has two inflection points (extrema) on the negative side of nonlinearity in the range between about −20 mT and about +20 mT. These positive-side inflection points and negative-side inflection points alternately occur.

As described above, nonlinearity distribution of the output voltage V+ and nonlinearity distribution of output characteristics with respect to a magnetic field correspond to nonlinearity distribution, with respect to the magnetic field, of resistance change characteristics of a magneto-resistive element. Therefore, nonlinearity distribution of change characteristics of combined resistance, which is obtained by combining the resistance of the first element section 11 with that of the second element section 12, with respect to the magnetic field also has two extrema on the positive side of nonlinearity and two extrema on the negative side in the range of a magnetic field between about −20 mT and about +20 mT inclusive.

In the first preferred embodiment, compared with the first comparative example and the second comparative example, the nonlinearity distribution of the output characteristics with respect to the magnetic field has a decreased nonlinearity and an increased linear range.

Thus, in the magnetic sensor 1 according to the first preferred embodiment, compared with the magnetic sensors according to the first comparative example and the second comparative example, linearity of the output is improved.

FIG. 6 is a diagram illustrating a condition for simulating the relationship between nonlinearity and sensitivity of magnetic sensors according to a comparative example and those according to examples of preferred embodiments of the present invention. FIG. 7 is a diagram illustrating a simulation result of the relationship between nonlinearity and sensitivity of magnetic sensors according to the comparative example and those according to the examples of preferred embodiments.

Referring to FIGS. 6 and 7, the simulation result of the relationship between nonlinearity and sensitivity of output characteristics will be described.

In simulation of the relationship between nonlinearity and sensitivity of output characteristics, a half-bridge circuit and a full-bridge circuit are defined by using each of the magneto-resistive elements according to a first comparative example and first to fourth examples of preferred embodiments. The nonlinearities of output characteristics determined in an application of a given magnetic field to these half-bridge circuits and full-bridge circuits and the sensitivities of the circuits were calculated.

Each magneto-resistive element according to the first comparative example is the magneto-resistive element according to the first comparative example described above. That is, each magneto-resistive element according to the first comparative example includes only the first element section 11 including the first unit element 13. Various parameters of the magneto-resistive elements according to the first comparative example are illustrated in FIG. 6: the disk diameter D of the upper ferromagnetic layer 137 in the first unit element was changed in the range between about 395.7 nm and about 45.5 nm; and the aspect ratio of the film thickness t of the upper ferromagnetic layer 137 with respect to the disk diameter D was changed in the range between about 0.038 and about 0.330.

As the magneto-resistive elements according to the first to fourth examples of preferred embodiments, magneto-resistive elements having the same or substantially the same configuration as that according to the first preferred embodiment were used. Various parameters used at that time are illustrated in FIG. 6.

In calculation of nonlinearity of output characteristics, the magnetization directions of the upper ferromagnetic layers 137 and 147 in an application of a given magnetic field are determined. In the determination of the magnetization directions, M-Hloop illustrated in FIG. 17 and Expressions (3) and (4) described below were used.

$$H = -\sum_{i,j} J_{i,j} S_i \cdot S_j \quad \text{Expression (3)}$$

$J$: Exchange interaction
$S$: Spin $$E_{total} = E_{exch} + E_d + E_{ext} + E_{an} \quad \text{Expression (4)}$$

$E_{exch}$: Exchange interaction
$E_d$: Magnetostatic(Shape anisotropy)
$E_{ext}$: External field(Zeeman)
$E_{an}$: Other magnetic anisotropy Subsequently, the relative angles of the fixed magnetization directions of the lower ferromagnetic layers 135 and 145 with respect to the determined magnetization directions of the upper ferromagnetic layers 137 and 147 as described above were used to calculate resistance values in consideration of the TMR effect. Specifically, Expressions (5), (6), and (7) described below were used.

$$G(\theta) = \frac{1}{2}(G_P + G_{AP}) + \frac{1}{2}(G_P - G_{AP})\cos\theta \quad \text{Expression (5)}$$

$G_P$: Parallel, $G(0°)$
$G_{AP}$: Antiparallel, $G(180°)$ $$\text{TMR ratio} = \frac{G_P - G_{AP}}{G_{AP}} = \frac{R_{AP} - R_P}{R_P} = \frac{2P_1P_2}{1 - P_1P_2} \quad \text{Expression (6)}$$

$P_1$: Polarization factor of free layer
$P_2$: Polarization factor of reference layer $$R(\theta) = \frac{1}{G(\theta)} \quad \text{Expression (7)}$$

When θ=90° in Expression (5) described above, cos θ=0. Thus, $G_{per}$ may be expressed as Expression (8) described below.

$$G_{per}: \text{Perpendicular}, G(90°) = \frac{1}{2}(G_p + G_{Ap}) \quad \text{Expression (8)}$$

From the relationship between this and Expression (7) described above, the resistance $R_{per}$ in the case where θ=90° may be expressed as Expression (9) described below.

$$R_{per} = \frac{2}{G_p + G_{AP}} \quad \text{Expression (9)}$$

From the relationship between Expression (9) described above and Expressions (5) to (7) described above, $G_p$, $G_{Ap}$, $R_p$, and $R_{Ap}$ may be expressed as Expressions (10) to (13) described below.

$$G_p = \frac{2(1 + \text{TMR ration})}{R_{per}(2 + \text{TMR ratio})} \quad \text{Expression (10)}$$

$$G_{Ap} = \frac{2}{R_{per}(2 + \text{TMR ratio})} \quad \text{Expression (11)}$$

$$R_P = \frac{R_{per}(2 + \text{TMR ratio})}{2(1 + \text{TMR ratio})} \quad \text{Expression (12)}$$

$$RA_p = \frac{R_{per}(2 + \text{TMR ratio})}{2} \quad \text{Expression (13)}$$

Nonlinearities of output characteristics were determined in the application of the given magnetic field to the half-bridge circuits and the full-bridge circuits including the corresponding magneto-resistive elements, having the resistance values calculated as described above, according to the first comparative example and the first to fourth examples of preferred embodiments. FIG. 7 illustrates the relationship between the nonlinearities of output characteristics and calculated sensitivities of the circuits.

As illustrated in FIG. 7, when the first comparative example is compared with the first to fourth examples of preferred embodiments, the first to fourth examples of preferred embodiments have small nonlinearities even when the first to fourth examples of preferred embodiments have the same or substantially the same sensitivity value as that of the first comparative example. That is, linearity of the output characteristics is improved.

In addition, in the first to fourth examples of preferred embodiments, sensitivity is improved even when each of the first to fourth examples of preferred embodiments has the corresponding nonlinearity value the same or substantially the same as that of the first comparative example.

As described above, the simulation result also proves improved linearity of output in the magneto-resistive element according to the first preferred embodiment and the magnetic sensor 1 including the same. Further, the simulation result also proves improved sensitivity. This means that the use of the technique of preferred embodiments of the present invention enables the principled limit of the tradeoff between sensitivity and nonlinearity of the related art to be exceeded.

FIGS. 8 to 13 are diagrams illustrating first to sixth steps of a non-limiting example manufacture process of the magnetic sensor according to the first preferred embodiment. Referring to FIGS. 8 to 13, a non-limiting example method of manufacturing the magnetic sensor 1 according to the first preferred embodiment will be described.

Figure 8:
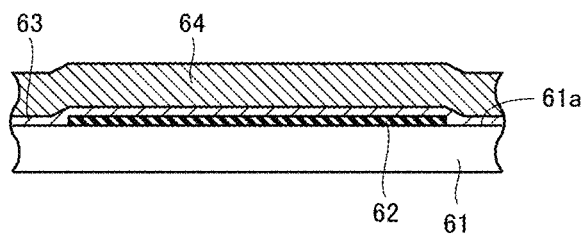
FIG. 8 is a diagram illustrating a first step of a manufacture process of a magnetic sensor according to the first preferred embodiment of the present invention.

As illustrated in FIG. 8, in the first step of the method of manufacturing the magnetic sensor 1, a substrate 61, on which an insulating layer 62 is formed, for example, through photolithography and dry etching in an area in which magneto-resistive elements are to be formed, is prepared. As the substrate 61, for example, an Si wafer may be used. The insulating layer 62 is formed of a silicon oxide film, for example.

Subsequently, an underlying film 63 is formed on a surface 61a of the substrate 61 so as to cover the insulating layer 62. As the underlying film 63, for example, Cu may be used.

Then, a TMR laminated film 64, from which the first unit element 13 and the second unit element 14 are to be formed, is formed on the underlying film 63.

Specifically, a lower electrode film, an anti-ferromagnetic film, a ferromagnetic film, a non-magnetic film, a lower ferromagnetic film, an insulating film, an upper ferromagnetic film, and a cap film are laminated in this sequence from the underlying film 63 side.

The lower electrode film, the anti-ferromagnetic film, the ferromagnetic film, the non-magnetic film, the lower ferromagnetic film, the insulating film, the upper ferromagnetic film, and the cap film are used to form the lower electrode layers 131 and 141, the anti-ferromagnetic layers 132 and 142, the ferromagnetic layers 133 and 143, the non-magnetic layers 134 and 144, the lower ferromagnetic layers 135 and 145, the insulating layers 136 and 146, the upper ferromagnetic layers 137 and 147, and the cap layers 138 and 148, respectively, after patterning of the TMR laminated film 64.

As the lower electrode film, for example, a Ru/Ta film is formed. As the ferromagnetic film/anti-ferromagnetic film which is the upper layer of the lower electrode film, for example, a CoFe/PtMn film is formed. This laminated film, in which exchange coupling occurs due to annealing in a magnetic field described below, defines and functions as a pin layer.

As the non-magnetic film which is the upper layer of the ferromagnetic film, for example, a Ru film is formed. As the lower ferromagnetic film which is the upper layer of the non-magnetic film, for example, a CoFeB film is formed.

The lower ferromagnetic film/non-magnetic film/ferromagnetic film has an SAF structure. The lower ferromagnetic film causes a reference layer having a securely fixed magnetization to be formed.

As the insulating film which is the upper layer of the lower ferromagnetic film, for example, a MgO film is formed. As the upper ferromagnetic film which is the upper layer of the insulating film, for example, a CoFeB film is formed. The upper ferromagnetic film among the upper ferromagnetic film/MgO/the lower ferromagnetic film causes a free layer to be formed. As the cap film which is the upper layer of the upper ferromagnetic film, for example, Ta/Ru is laminated.

Subsequently, the substrate 61, on which the TMR laminated film 64 is formed, is annealed in a magnetic field to fix a magnetization direction of the lower ferromagnetic film from which the lower ferromagnetic layers 135 and 145 defining and functioning as reference layers are to be formed.

Specifically, the substrate 61 is annealed in a magnetic field locally to obtain a desired magnetization direction for each area in which the corresponding magneto-resistive element included in the bridge circuit is to be formed. In each magneto-resistive element, the magnetization direction of the lower ferromagnetic film in the area corresponding to the first unit element 13 is made opposite to that in the area corresponding to the second unit element 14.

The magnetization direction of the lower ferromagnetic film in the area corresponding to the first unit element 13 in the first magneto-resistive element described above is made opposite to that in the area corresponding to the first unit element in the second magneto-resistive element.

The magnetization direction of the lower ferromagnetic film in the area corresponding to the first unit element 33 in the third magneto-resistive element is made opposite to that in the area corresponding to the first unit element in the fourth magneto-resistive element.

The magnetization direction of the lower ferromagnetic film in the area corresponding to the first unit element 13 in the first magneto-resistive element described above is made opposite to that in the area corresponding to the first unit element in the third magneto-resistive element.

Figure 9:
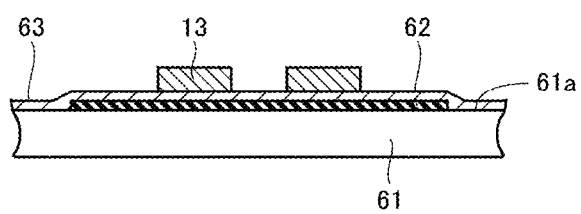
FIG. 9 is a diagram illustrating a second step of a manufacture process of a magnetic sensor according to the first preferred embodiment of the present invention.

As illustrated in FIG. 9, in the second step of the method of manufacturing the magnetic sensor 1, the TMR laminated film is patterned into desired shapes using, for example, photolithography and dry etching. Thus, the first unit element 13 and the second unit element 14 are formed. The first unit element 13 and the second unit element 14 are formed in a disk shape. At that time, the disk diameter of the first unit element 13 is made smaller than that of the second unit element 14.

Thus, in each of the first to fourth magneto-resistive elements, the resistance of the first element section 11 (first unit element 13) is larger than that of the second element section (second unit element 14).

For example, in the case where a half-bridge circuit is formed by using magneto-resistive elements each including only the first element section 11, the resistance value of the first element section 11 is set to about 10 k$\Omega$; the sensitivity of the half-bridge circuit is set to about 1.27 mV/(mT·V); and nonlinearity is set to about 1.69% Fs in the range between about −20 mT and about +20 mT.

For example, in the case where a half-bridge circuit is formed using magneto-resistive elements each including only the second element section 12, the resistance value of the second element section 12 is set to about 1.3 k$\Omega$; the sensitivity of the half-bridge circuit is set to about −2.42 mV/(mT·V); and the nonlinearity is set to about 7.91% Fs in the range between about −20 mT and about +20 mT.

That is, the absolute value of the sensitivity of the first unit element 13 is made smaller than that of the second unit element 14. Nonlinearity of the resistance change characteristics of the first unit element 13 is made smaller than that of the second unit element 14.

In FIG. 9, only a single first unit element 13 and a single second unit element 14 are disclosed. The number of first unit elements 13 and the number of second unit elements 14 may be plural. In this case, multiple first unit elements 13 are connected, for example, in series, and multiple second unit elements 14 are connected, for example, in series.

Figure 10:
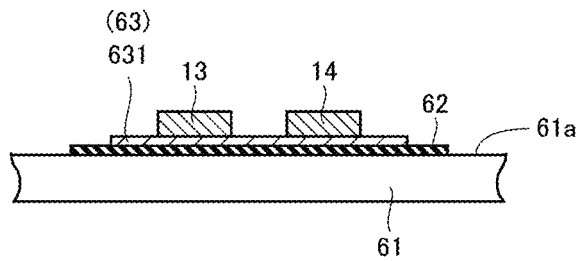
FIG. 10 is a diagram illustrating a third step of a manufacture process of a magnetic sensor according to the first preferred embodiment of the present invention.

As illustrated in FIG. 10, in the third step of the method of manufacturing the magnetic sensor 1, the underlying film is patterned, for example, using photolithography and dry etching to form a wiring pattern 631.

Figure 11:
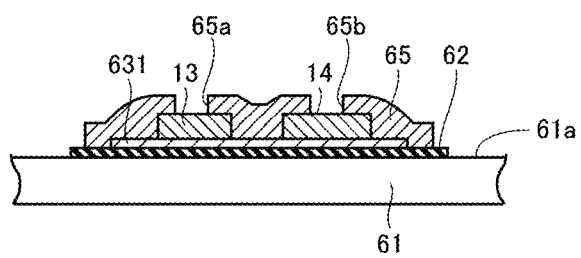
FIG. 11 is a diagram illustrating a fourth step of a manufacture process of a magnetic sensor according to the first preferred embodiment of the present invention.

As illustrated in FIG. 11, in the fourth step of the method of manufacturing the magnetic sensor 1, an interlayer insulating film is formed over the entire or substantially the entire surface of the substrate 61. The formed interlayer insulating film is patterned using, for example, photolithography and dry etching. Thus, an interlayer insulating layer 65 is formed so as to cover the first unit element 13, the second unit element 14, and the wiring pattern 631, and contact holes 65a and 65b are formed through the interlayer insulating layer 65.

Figure 12:
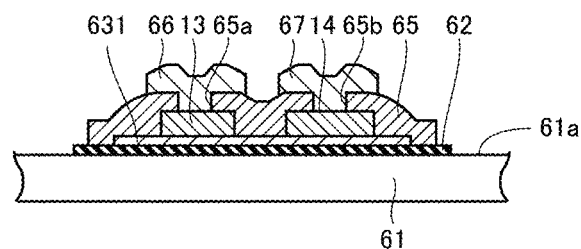
FIG. 12 is a diagram illustrating a fifth step of a manufacture process of a magnetic sensor according to the first preferred embodiment of the present invention.

As illustrated in FIG. 12, in the fifth step of the method of manufacturing the magnetic sensor 1, a first wiring section 66 and a second wiring section 67 are formed using, for example, photolithography and lift-off. The first wiring section 66 and the second wiring section 67 are, for example Cu wiring.

The first wiring section 66 is connected to the first unit element 13 through the contact hole 65a. The second wiring section 67 is connected to the second unit element 14 through the contact hole 65b.

Figure 13:
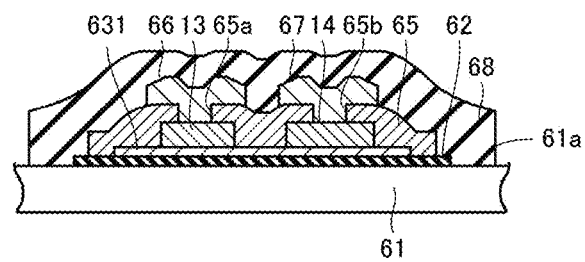
FIG. 13 is a diagram illustrating a sixth step of a manufacture process of a magnetic sensor according to the first preferred embodiment of the present invention.

As illustrated in FIG. 13, the sixth step of the method of manufacturing the magnetic sensor 1, a passivation film is formed over the entire or substantially the entire surface of the substrate 61. The passivation film is, for example, an SiO$_2$ film. The passivation film is patterned using, for example, photolithography and dry etching, and openings are formed at desired positions. Thus, the magnetic sensor 1 is manufactured.

In the magnetic sensor 1 manufactured after the steps described above, the resistance value of a magneto-resistive element is about 11.2 k$\Omega$; the sensitivity of a half-bridge circuit is about 0.86 mV; and the nonlinearity of the output characteristics is about 0.36% FS in the range between about −20 mT and about +20 mT.

Thus, in the magnetic sensor 1, the linearity of the output characteristics is improved compared with the related-art magneto-resistive element (the magneto-resistive element according to the first comparative example) including only the first element section 11 and the related-art magneto-resistive element (the magneto-resistive element according to the second comparative example) including only the second element section 12.

Specifically, the first unit element 13 and the second unit element 14, which each have a magnetic vortex structure, are connected in series. The direction of the fixed magnetization of the lower ferromagnetic layer 135 (first reference layer) in the first unit element 13 is opposite to that of the lower ferromagnetic layer 145 (second reference layer) in the second unit element 14.

Thus, the nonlinearity is canceled between the first unit element 13 side and the second unit element 14 side, achieving improved linearity of the output characteristics.

Specifically, the nonlinearity distribution, with respect to a magnetic field, of the resistance change characteristics of the first unit element 13 and that of the second unit element 14 have inverse signs. Thus, the nonlinearity is canceled between the first unit element 13 side and the second unit element 14 side.

In addition, the direction of the resistance change of the first element section 11 with respect to the external magnetic field and that of the second element section 12 have inverse signs. Thus, the nonlinearity is canceled between the first unit element 13 side and the second unit element 14 side.

Second Preferred Embodiment

Figure 14:
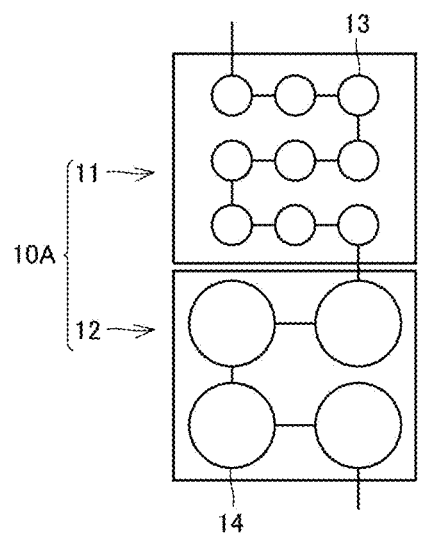
FIG. 14 is a schematic plan view of a magneto-resistive element according to a second preferred embodiment of the present invention.
Figure 15:
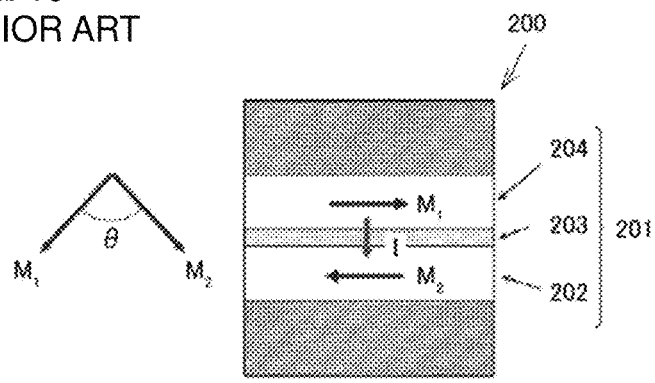
FIG. 15 is a schematic view illustrating the direction of magnetization M1 of a free layer and the direction of magnetization M2 of a pinned layer in a magnetic tunnel junction element of the related art in which the free layer and the pinned layer are disposed with an insulating layer interposed therebetween.
Figure 16:
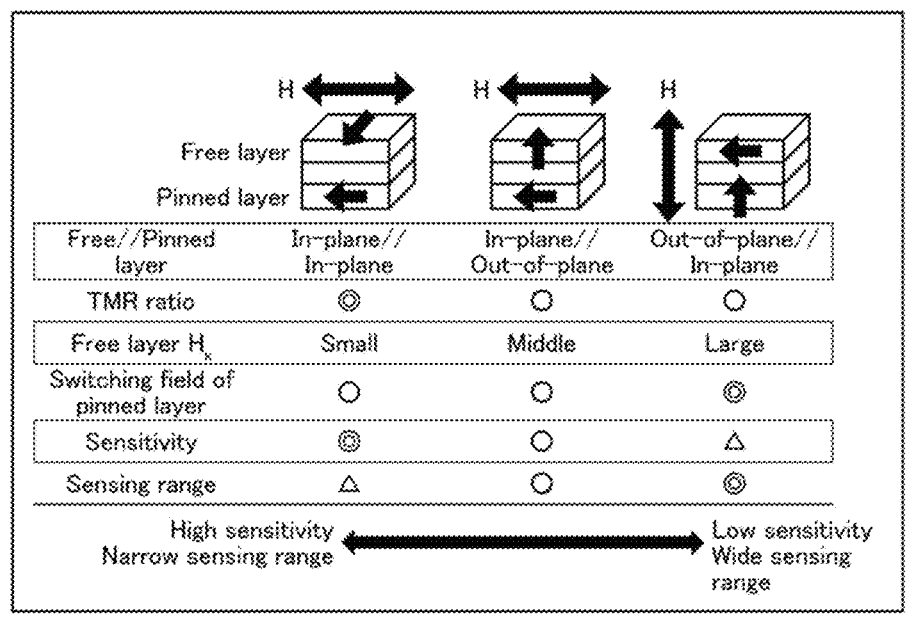
FIG. 16 is a diagram illustrating various magnetic tunnel junction elements of the related art and characteristics of the magnetic tunnel junction elements.

FIG. 14 is a schematic plan view of a magneto-resistive element according to a second preferred embodiment of the present invention. Referring to FIG. 14, a magneto-resistive element 10A according to the second preferred embodiment will be described.

As illustrated in FIG. 14, compared with the magneto-resistive element 10 according to the first preferred embodiment, a magneto-resistive element 10A according to the second preferred embodiment has a different configuration of the first element section 11 and the second element section 12. The remaining configurations are the same or substantially the same.

The first element section 11 includes multiple first unit elements 13. The first unit elements 13 are connected in series. Specifically, the cap layers 138 and the lower electrode layers 131 are connected alternately between adjacent first unit elements 13.

The second element section 12 includes multiple second unit elements 14. The second unit elements 14 are connected in series. Specifically, the cap layers 148 and the lower electrode layers 141 are connected alternately between adjacent second unit elements 14.

The number of first unit elements 13 is greater than the number of second unit elements 14. Thus, the resistance of the first element section 11 including the first unit elements 13 is greater than the resistance of the second element section 12 including the second unit elements 14.

Even with this configuration, the magneto-resistive element 10A according to the second preferred embodiment and the magnetic sensor including the same have the same or substantially the same advantageous effects as those of the magneto-resistive element 10 according to the first preferred embodiment and the magnetic sensor 1 including the magneto-resistive element 10.

In the first and second preferred embodiments, the case in which the magneto-resistive elements are TMR elements is described as an example. This is not limiting. GMR elements, for example, may be used.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A magneto-resistive element comprising:
a first element section that includes a plurality of first unit elements; and
a second element section that includes a plurality of second unit elements; wherein
the first element section is connected to the second element section in series between a supply electrode or a ground electrode and an output electrode;
each of the plurality of first unit elements includes a first reference layer and a first free layer, the first reference layer including a first film surface and having magnetization fixed in an in-plane direction of the first film surface, the first free layer including a vortex magnetization about an axis perpendicular or substantially perpendicular to the first film surface, the vortex magnetization including a center that moves in accordance with an external magnetic field;
each of the plurality of second unit elements includes a second reference layer and a second free layer, the second reference layer including a second film surface parallel or substantially parallel to the first film surface and including magnetization fixed in an in-plane direction of the second film surface, the second free layer including a vortex magnetization about an axis perpendicular or substantially perpendicular to the second film surface, the vortex magnetization including a center that moves in accordance with the external magnetic field; and
a direction of the fixed magnetization of the first reference layer of each of the plurality of first unit elements is opposite to a direction of the fixed magnetization of the second reference layer of each of the plurality of second unit elements.

2. The magneto-resistive element according to claim 1, wherein nonlinearity distribution, with respect to the magnetic field, of resistance change characteristics of the plurality of first unit elements and nonlinearity distribution, with respect to the magnetic field, of resistance change characteristics of the plurality of second unit elements have inverse signs.

3. The magneto-resistive element according to claim 1, wherein nonlinearity distribution, with respect to the magnetic field, of change characteristics of combined resistance of the first element section and the second element section includes two extrema on a positive side of the nonlinearity in a range of the magnetic field to be detected.

4. The magneto-resistive element according to claim 1, wherein a direction of resistance change of the first element section with respect to the external magnetic field and a direction of resistance change of the second element section with respect to the external magnetic field have inverse signs.

5. The magneto-resistive element according to claim 1, wherein a resistance of the first element section is greater than a resistance of the second element section.

6. The magneto-resistive element according to claim 5, wherein
an absolute value of sensitivity of the plurality of first unit elements is smaller than an absolute value of sensitivity of the plurality of second unit elements; and
nonlinearity of resistance change characteristics of the plurality of first unit elements is smaller than nonlinearity of resistance change characteristics of the plurality of second unit elements.

7. The magneto-resistive element according to claim 1, wherein
the first free layer and the second free layer have disk shapes; and
a diameter of the second free layer is larger than a diameter of the first free layer.

8. The magneto-resistive element according to claim 1, wherein a number of the plurality of first unit elements is greater than a number of the plurality of second unit elements.

9. A magnetic sensor comprising:
a plurality of magneto-resistive elements, each of the magneto-resistive elements being the magneto-resistive element according to claim 1; wherein the plurality of magneto-resistive elements include a first magneto-resistive element and a second magneto-resistive element which define a half-bridge circuit; and the direction of the fixed magnetization of the first reference layer in the first magneto-resistive element is opposite to the direction of the fixed magnetization of the first reference layer in the second magneto-resistive element.

10. The magnetic sensor according to claim 9, wherein the plurality of magneto-resistive elements further include a third magneto-resistive element and a fourth magneto-resistive element;

the third magneto-resistive element and the fourth magneto-resistive element define a second half-bridge circuit;

the first half-bridge circuit and the second half-bridge circuit define a full-bridge circuit;

the direction of the fixed magnetization of the first reference layer in the first magneto-resistive element is opposite to the direction of the fixed magnetization of the first reference layer in the second magneto-resistive element;

the direction of the fixed magnetization of the first reference layer in the third magneto-resistive element is opposite to the direction of the fixed magnetization of the first reference layer in the fourth magneto-resistive element; and the direction of the fixed magnetization of the first reference layer in the first magneto-resistive element is opposite to the direction of the fixed magnetization of the first reference layer in the third magneto-resistive element.

11. The magnetic sensor according to claim 9, wherein, in each of the plurality of magneto-resistive elements, nonlinearity distribution, with respect to the magnetic field, of resistance change characteristics of the plurality of first unit elements and nonlinearity distribution, with respect to the magnetic field, of resistance change characteristics of the plurality of second unit elements have inverse signs.

12. The magnetic sensor according to claim 9, wherein, in each of the plurality of magneto-resistive elements, nonlinearity distribution, with respect to the magnetic field, of change characteristics of combined resistance of the first element section and the second element section includes two extrema on a positive side of the nonlinearity in a range of the magnetic field to be detected.

13. The magnetic sensor according to claim 9, wherein, in each of the plurality of magneto-resistive elements, a direction of resistance change of the first element section with respect to the external magnetic field and a direction of resistance change of the second element section with respect to the external magnetic field have inverse signs.

14. The magnetic sensor according to claim 9, wherein, in each of the plurality of magneto-resistive elements, a resistance of the first element section is greater than a resistance of the second element section.

15. The magnetic sensor according to claim 9, wherein, in each of the plurality of magneto-resistive elements:

an absolute value of sensitivity of the plurality of first unit elements is smaller than an absolute value of sensitivity of the plurality of second unit elements; and nonlinearity of resistance change characteristics of the plurality of first unit elements is smaller than nonlinearity of resistance change characteristics of the plurality of second unit elements.

16. The magnetic sensor according to claim 9, wherein, in each of the plurality of magneto-resistive elements:

the first free layer and the second free layer have disk shapes; and a diameter of the second free layer is larger than a diameter of the first free layer.

17. The magnetic sensor according to claim 9, wherein, in each of the plurality of magneto-resistive elements, a number of the plurality of first unit elements is greater than a number of the plurality of second unit elements.

18. A magneto-resistive element comprising:

a first element section that includes one or more first unit elements; and a second element section that includes one or more second unit elements; wherein the first element section is connected to the second element section in series between a supply electrode or a ground electrode and an output electrode;

each first unit element includes a first reference layer and a first free layer, the first reference layer including a first film surface and having magnetization fixed in an in-plane direction of the first film surface, the first free layer including a vortex magnetization about an axis perpendicular or substantially perpendicular to the first film surface, the vortex magnetization including a center that moves in accordance with an external magnetic field;

each second unit element includes a second reference layer and a second free layer, the second reference layer including a second film surface parallel or substantially parallel to the first film surface and including magnetization fixed in an in-plane direction of the second film surface, the second free layer including a vortex magnetization about an axis perpendicular or substantially perpendicular to the second film surface, the vortex magnetization including a center the moves in accordance with the external magnetic field;

a direction of the fixed magnetization of the first reference layer is opposite to a direction of the fixed magnetization of the second reference layer; and a number of the one or more first unit elements in the first element section is different than a number of the one or more second unit elements in the second element section.

* * * * *